United States Patent [19]

Nellis et al.

[11] Patent Number: 5,158,930
[45] Date of Patent: Oct. 27, 1992

[54] METHOD OF IMPROVING SUPERCONDUCTING QUALITIES OF FABRICATED CONSTRUCTS BY SHOCK PREPROCESSING OF PRECURSOR MATERIALS

[75] Inventors: William J. Nellis, Berkeley; M. Brian Maple, Del Mar, both of Calif.

[73] Assignee: The United States of America as represented by the United States Department of Energy, Washington, D.C.

[21] Appl. No.: 449,176

[22] Filed: Dec. 13, 1989

[51] Int. Cl.$^5$ .......................................... H01L 39/12
[52] U.S. Cl. ....................................... 505/1; 505/725; 505/739; 264/61; 264/84
[58] Field of Search ............... 264/84, 61; 505/1, 725, 505/739

[56] References Cited

U.S. PATENT DOCUMENTS 5,073,209 12/1991 Giancola ................................. 505/1

OTHER PUBLICATIONS

Morosin et al., "High Pressure Shock Modification and Synthesis of Superconducting Ceramic Oxides" *Synth. Met.* 33 (2), 185–224 Nov. 15, 1989.
Murr et al. "Shock Wave Induced Changes in Superconductivity in YBa$_2$Cu$_3$O$_{7-\delta}$" *App Phys Lett* 55 (15) pp. 1575–1577 Oct. 9, 1989.
Johnson et al. "Fabrication of Ceramic Articles From High T$_c$ Superconducting Oxides" *Extended Abstracts—High Temp Superconductors* Apr. 23–24, 1987.
Tien et al., *Extended Abstracts—High Temp Superconductors II* Apr. 5–9, 1988.
Abstract of Conference Paper by Nesterenko, "The Modification of Superconducting Properties of Y-Ba-Cu-O and Bi-Sr-Ca-Cu-O Using Shock Waves" Aug. 14–17, 1989 Proc. Am. Phys. Soc.
Abstract of Conference Paper by Iqbal et al, "Microstructure and Superconductivity of Shock Processed High T$_c$ Superconductors" Jul. 23–28, 1989. Intl. Conf. on Matls and Mechanisms of Superconductivity: High Temperature Superconductors II.
Iqbal et al., Appl. Phys., pp. 2339–2341 (1989).
"Magnetic & Electrical Properties of Shock-Compacted High-T$_c$ Superconductors", Nellis, Lawrence Livermore Nat'l Laboratory (1990).
"Magnetic Properties of Shock-Compacted High-T$_c$ Crystals", Weir et al., Lawrence Livermore National Laboratory (Abstract Only) (1990).
"Oriented Superconducting Bi$_2$Sr$_2$CaCu$_2$O$_8$ by Shock Compaction of Pre-Aligned Powders", McCandless et al., Lawrence Livermore National Laboratory (Abstract Only) (1990).
Venturini et al., Bulletin of the American Physical Society, p. 631, vol. 35, No. 3 (1990) (Abstract Only).
(List continued on next page.)

Primary Examiner—James Lowe
Assistant Examiner—Christopher A. Fiorilla
Attorney, Agent, or Firm—Miguel A. Valdes; Henry P. Sartorio; William R. Moser

[57] ABSTRACT

Disclosed is a method of improving the physical properties of superconducting materials which comprises:
a. applying a high strain rate deformation to said material in an amount sufficient to produce defects serving as flux-pinning sites therein, and
b. heating said material to a temperature up to about 1000° C. in an oxygen atmosphere for a period of time sufficient to anneal it.

2 Claims, 3 Drawing Sheets

OTHER PUBLICATIONS

Weir et al., Physica C 162–164 (1989) 1263–1264, North Holland, "Effects Of Shock-Induced Defects On Flux Pinning In $YBa_2Cu_3O_{7-\delta}$".

Nellis et al., Physica C 166 (1990) 115–124, North Holland, "Deformation Induced Defects in $ReBa_2Cu_3O_{7-\delta}$".

W. J. Nellis et al., "Shock Compaction of $YBa_2Cu_3O_{7-x}$ and $HoBa_2Cu_3O_{7-x}$ Powders In A Metal Matrix", pp. 249–264 (Abstract Only).

Weir et al., Increase In The Flux-Pinning Energy Of $YBa_2Cu_3O_{7-\delta}$ By Shock Compaction.

C. L. Seaman et al., Crystallographically-Oriented Superconducting $Bi_2Sr_2CaCu_2O_8$ by Shock Compaction Of Pre-Aligned Powder.

Nellis et al., Shock-Induced Melting and Rapid Solidication (1988).

Nellis et al., Synthesis of Metastable Superconductors By High Dynamic Pressure, SPIE vol. 878 (1988) Incomplete, Abstract Only.

Nellis et al., Micron-Thin NbFilms Recovered From MBAR Shock Pressures, Preprint (1989) Incomplete Title & Author Information Only.

Neumeier et al., Metastable A15 Phase $Nb_3Si$ Synthesized by High Dynamic Pressure, High Pressure Research, vol. 1, pp. 267–289 (1989).

Hagino et al, Microstructures and Superconducting Properties of Y-Ba-Cu Oxide Coils Prepared By The Explosive Compaction Technique.

Iqbal et al., Shock Wave Synthesis And Processing Of High Temperature Superconductors With Defect Microstructures.

METHOD OF IMPROVING SUPERCONDUCTING QUALITIES OF FABRICATED CONSTRUCTS BY SHOCK PREPROCESSING OF PRECURSOR MATERIALS

The United States Government has rights in this invention pursuant to Contract No. W-7405-ENG-48 between the U.S. Department of Energy and the University of California, for the operation of Lawrence Livermore National Laboratory.

BACKGROUND OF THE INVENTION

This invention is related to the shock compaction preprocessing of high Tc superconducting starting materials which are to be fabricated into various superconducting constructs.

The novel physical properties of high-temperature superconducting materials create substantial challenges for their use in practice applications. In particular, the low magnetic flux pinning energies found in high-temperature superconductors severely limit the critical current densities of these materials (Khurana, *Phys. Today*, p. 17, 1989). For example, the pinning energy, $U_o$, of superconducting fluxoids is a few hundredths of an eV at finite temperatures. This energy is small compared to about 1 eV fluxoid pinning energy for conventional superconductors. The combination of small flux-pinning energies and the persistence of superconductivity to higher critical temperatures, ($T_c$), causes large flux-creep rates and melting of the Abrikosov flux lattice at a temperature $T_m < T_c$.

It is a possibility that weak flux pinning is observed by broad resistive transitions in a magnetic field (Tinkham, *Phys. Rev. Lett.*, Vol. 61, p. 1658, 1988) and small intrinsic or intragranular critical current densities $J_c$. For $YBa_2Cu_3O_{7-e}$, for example, $T_c = 90°$ K., $T_m \approx 80°$ K., and $U_o = 0.02$ eV at 70° K. (Gammel, et al., *Phys. Rev. Lett.*, Vol. 61, p. 1666, 1988; Roas et al., *Appl. Phys. Lett.*, Vol. 54, p. 1051, 1989) The need to increase $U_o$ and $J_c$ is especially great at 77 K in order to facilitate economically feasible applications of high-$T_c$ materials with liquid nitrogen as a coolant.

Another characteristic of the new high $T_c$ superconductors is that they often require relatively high temperature sintering processing for a variety of reasons. It would be very advantageous to be able to modify the temperature required for effective sintering of these materials.

METHODS OF INCREASING FLUX-PINNING ENERGY

Various methods have been used to introduce high densities of defects into the lattice of a high-temperature superconductor, with the hope that such defects would greatly increase the intrinsic critical current density. Point defects capable of pinning fluxoids have been generated by ion irradiation (Roas et al., *Appl. Phys. Lett.*, Vol. 54, p. 1051, 1989; Willis et al., *Appl. Phys. Lett*, Vol. 53, p. 417, 1988; Chrisey et al., *Appl. Phys. Lett*, Vol. 53, p. 1001, 1988), neutron irradiation (Kupfer et al., *Phys. Bulletin*, Vol. 69, p. 167, 1987; Cost et al., *Phys. Rev. Bulletin*, Vol. 37, p. 1563, 1988.), and electron irradiation (Matsui et al., *Japan. Journal Appl. Phys.*, Vol. 26, L. 1183, 1987).

Unfortunately, such methods of introducing high density defects also introduce considerable atomic disorder into the lattice structure of the superconducting material, and usually result in a lowering of the critical temperature at which superconductivity is possible. More recently, a 100-fold increase in $J_c$ at 77° K. and 9 kOe, induced in a single crystal of $YBa_2Cu_3O_7$ by $8 \times 10^{16}$ cm$^{-2}$ of fast neutrons (E>1 MeV), has been reported (van Dover et al., *Nature*, Vol. 342, p. 55, 1989). Unfortunately, these methods of inducing flux-pinning defects cannot be scaled economically to large quantities of materials.

Defects have also been introduced into superconducting materials by mechanically stressing high-$T_c$ superconductors. The resulting shear stresses create dislocations in the structure of these materials. Kramer et al., (*J. Mat. Science*, in press, 1989) have studied the defects created in $YBa_2Cu_3O_{7-e}$ ceramics by slowly deforming the material in a uniaxial press, and reported that their deformation experiments created considerable numbers of dislocations with line vectors of <100> and <110>.

Extremely high mechanical stresses and strain rates can be obtained by shock-compression techniques. Typically, when shock pressures of 100 kbar are applied for a microsecond, dislocation densities up to $10^{11}$ cm$^{-2}$ or more are produced in oxides (Morosin et al., *Shock Waves in Condensed Matter*, Asay Ed., Elsevier, Amsterdam, p. 355, 1984). Because of the high strain rate, it is believed that there is insufficient time for most dislocations to slip in response to the applied shear stresses. Instead, it is believed that extremely high densities of dislocations must be generated during the passage of the shock wave to accommodate the high stress and strain rates. Indeed, high densities of defects have been observed in shocked high-$T_c$ oxides (Murr et al., *Journal of Metals*, Vol. 40 p. 19, 1988).

Current Processing Techniques

Historically, a variety of scientific approaches have been employed by research groups in an attempt to synthesize or fabricate useful superconducting products using strong shock waves. These efforts have met with varying degrees of success. As an example, conventional superconducting materials have been synthesized by Roy using an explosive compaction process (U.S. Pat. No. 3,752,665 granted to Roy et al., Aug. 14th, 1973).

Since the development of the revolutionary high-$T_c$ superconductors, new fabrication techniques have been developed by the research community in an attempt to deal with the physical limitations of these materials. For instance, these new materials are highly brittle in nature, and are easily deformed by most standard manipulation techniques. Also, many conventional methods of processing compromise or destroy the new materials' superconducting qualities. Attempts to provide processing techniques which do not unduly comprise the superconducting capacity of these new materials have been only marginally successful.

Ceramic Processing—Ceramic processing techniques have been developed by researchers at AT&T Bell Laboratories in an attempt to provide a practical, workable form for the new high-$T_c$ superconductors. The doctor-blade tape casting technique is an example of this approach. Ceramic powder is mixed with a binder, a plasticizer, and a dispursant. The resulting solution is deposited at a controlled thickness on a plastic film. The solvent is evaporated to produced a flexible tape. Because of non-conductive organic components in the tape, this tape is not electrically superconducting. Slow heating $YBa_2Cu_3O_{7-x}$ tapes to 300° C. removes the undesirable components, and weakly bonds the powder. Heating to 900°–1000° C. produces a dense but brittle superconducting structure.

Ceramic processing techniques have also been investigated by researchers at Argonne National Laboratories and other institutions in an effort to develop wire extrusion techniques which could be successfully applied to the new high-$T_c$ materials. In this approach, a tape casting type slurry is partially dried to produce a material with a viscous consistency. This material is extruded into a wire form and then coiled. Firing yields a solid ceramic superconducting wire.

Other ceramic processing approaches to providing workable constructs from the new high-$T_c$ materials have also been investigated. Fine ceramic oxide powders in an organic vehicle have been printed onto a substrate through a screen in order to produce circuitry patterns. In a related process, plasma spray techniques have been used to coat arbitrary shapes producing superconducting composite surfaces.

Metallurgical Processing—A number of researchers have used the classic cold drawing technology to fabricate superconducting wire by packing superconducting powder in a silver tube and then reducing the tube's diameter by 10 to $10^2$ times. The resulting powder material must then be fired in order to restore its superconducting qualities. In the cold drawing technique, the superconducting oxide must be rolled down to a thickness of only about 0.1 mm to achieve crystallographic alignment.

An example of this method is Ag-sheathed Bi-Pb-Sr-Ca-Cu-O wires which were found to have preferential crystalline alignment with the basal-plane high-$T_c$ crystallographic direction along the length of the wire ("Ag-Sheathed Bi-Pb-Sr-Ca-Cu-O Superconducting Wires with High Critical Current Density," T. Hikata et al., *Japan: Journal Appl. Phys;* 28, L-82-L84 (1989)).

It is desirable to achieve oriented crystallographic oxide layers with high densities of crystalline defects to achieve higher critical current densities both in zero and finite magnetic fields than have been observed to date.

Melt-Texture Growth—In this method, sintered bars of $YBa_2Cu_3O_{7-x}$ which are about one centimeter long are melted and then directionaly solidified. This approach produces fully dense, long, needle shaped grains of superconducting constructs. The resulting needle axis of these grains corresponds to the a or b axis of the orthorhombic structure of the high-$T_c$ material. These are crystallographic directions of highest critical current density. However, producing long wire this way is not practical.

Shock Compaction—Processing superconductors by shock compaction has shown great promise in the superconductor fabrication research area. A patent granted to applicants (U.S. Pat. No. 4,717,627, granted Jan. 5, 1988) and a patent issuing from its continuing application U.S. Pat. No. 4,762,754, granted Aug. 9th, 1988) provided the first practical methods of shock compacting the new superconducting materials including the new high-$T_c$ materials. These patents are incorporated into the present application by reference thereto.

The extremely high speed and short time of the shock wave used in this method allows boundaries between particles to heat and bond without significantly heating the center portions of the particles. In some cases, this effect can be enhanced by mixing the superconducting materials with metal powders to act as a ductile electrical conducting binder. The limitation of heating of the interiors of the particles is caused by the short (microsecond) duration of the compressive pulse and the high thermal quench rate at the inter-particle boundaries. By maintaining relatively cool temperatures in the interiors of particles the crystal structure and superconducting properties of the bulk of the material are maintained. On the other hand, surface heating allows heterogeneous processing of inter-particle boundaries. In this way, the structure of the inter-particle boundaries might be tuned to optimize critical current density between particles. By choosing each particle to be a single crystallite, all grain boundaries could be optimized for critical current density.

Materials processed by shock compaction enjoy a number of characteristics not seen in the uncompacted superconducting materials, or in superconductors processed by other methods. Shock compaction creates modifications in the microstructure of the new high-$T_c$ materials, which change the functioning of the resulting fabrications. The shock compacting step increases conductivity of some superconducting materials. It also allows the use of effectively lower sintering times and temperatures. These modified sintering characteristics minimize the decrease of superconducting qualities to the starting materials which can occur during other aspects of processing.

Process Limitations—The presently available methods for fabrication of high-$T_c$ materials suffer from a number of limitations. Consistent current flow through the fabricated materials over even a small distance has not been reliably achieved. All of the above discussed fabrication methods including prior shock compaction methods serve to deform to varying degrees the microstructure of the superconducting material during processing. This effect can severely compromise the superconducting function of the material.

Slow pressing and related methods cause the materials being processed to be subjected to torsion and other deforming forces. The resulting deformation likewise compromises the critical internal physical structure of the superconducting particles. Additionally, the high-temperature, relatively long term post fabrication sintering required in such fabrication methods also leads to softening or melting of internal structure of the superconducting particles, often destroying their superconducting characteristics.

There are presently a number of limitations to the characteristics of the new high Tc superconducting materials which have made their use in most practical applications impractical. One of the greatest hurdles in the use of these materials is their low magnetic flux pinning energies which severely limit the intragranular critical current densities of these materials.

There is a need for a method by which large flux-pinning energies can be introduced into these materials. If this were accomplished, these materials would be highly advantageous compared to currently available materials in a wide variety of uses. Ideally, the introduced changes would persist even through high temperature treatment and other processing techniques. Such an advance in superconducting technology might well open this area of scientific investigation which previously was mainly of academic interest to very large-scale applicability and almost limitless practical uses.

SUMMARY OF THE INVENTION

An object of this invention is to improve the superconducting and other qualities of superconducting constructs by preprocessing the superconducting materials prior to their manufacture into useful forms.

An other object of this invention is to allow a low-cost method of improving the qualities of superconducting articles of manufacture by a simple preprocessing step which improves the superconducting capacity of the superconducting materials.

It is an additional object of the present invention to provide an improved superconducting material for use in processing whose defect structure is modified and whose improvements are retained even after annealing at temperature as high as 900° C.

The present invention provides for a novel method of preprocessing superconducting materials using shock compaction in order to improve the superconducting qualities and modify sintering characteristics of the final material.

Exploiting the quality of crystalline defects which can serve as pinning sites for fluxoids, the present invention process increases $U_o$ and thus intrinsic $J_c$'s by introducing a suitable defect structure into the crystalline lattice structure of the superconducting material. For effective flux-pinning, a high density of defects is needed. The defects are so produced as to avoid introducing excessive disorder which has the potential of compromising superconducting properties such as $T_c$. For applied purposes, the defects are so introduced as to produce a large enhancement of $U_o$ at temperature near that of liquid nitrogen, i.e. 77 K. Also, desirable defects are so accomplished as for large $U_o$ to persist after high-temperature heat treatments if such are required. Further, the inventive method is capable of defecting substantial quantities of materials efficiently.

The present invention method improves the general qualities and characteristics superconductors. However, using the inventive method, superconducting materials can be modified in a controlled and measured manner so as to provide improvements particularly suited to a specific use or advantageous in a further processing step. The controlled introduction of dislocations and/or stacking faults by the methods of the present invention can produce custom designed materials of particular value to an anticipated use. This advantage of the present invention provides greater flexibility in processing approaches and a wider range of applications for the finished materials.

DETAILED DESCRIPTION

Figure 1:
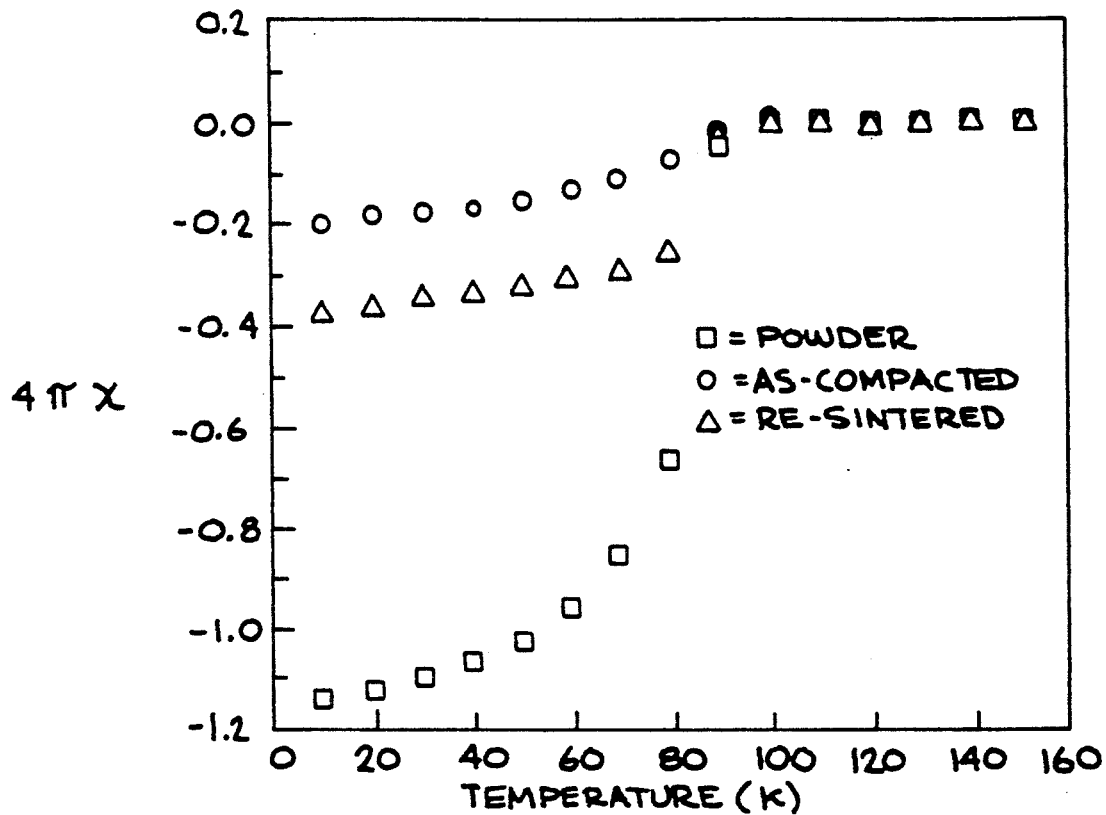
FIG. 1 is a graph that shows the zero-field-cooled diamagnetic susceptibility at 30 Oe as a function of temperature for the starting $YBa_2Cu_3O_{7-8}$+Ag powder, the as-shocked $YBa_2Cu_3O_{7-8}$+Ag composite, and the shocked+re-annealed composite.

The present invention encompasses introducing shock-induced defects into superconducting starting materials in order to improve the superconductive qualities of the final product, in particular, the intrinsic or intragranular critical current density. The inventive method has broad applicability, and can be usefully employed in virtually all of the presently known fabrication methods for superconductors, such as those described in the background section of this application.

There are several special advantages to the present invention. Many of these advantages are surprising and unexpected in view of the conventional explanation of the defect phenomena, or even when considering general material processing expectations.

One would expect that the inventive defects, dislocations, and other effects of the inventive process would be compromised or even eliminated when further material processing involves heating to temperatures up to 900° C. Suprisingly, the modifications introduced actually cause high densities of other defects, stacking faults, to remain after high-temperature heat treatment. This unexpected finding is especially relevant as most superconducting processing methods involve such post-fabrication high-temperature processing.

The flux-pinning qualities of the present inventive precursor materials also have proven to be unexpectedly resilient to grinding. It is surprising that such thorough and energetic processing of these generally delicate materials would not detract from advantageous flux-pinning qualities with which the present inventive process imbues superconducting materials. This quality of the inventive materials has special implications for processing techniques, as the starting materials can be pre-processed en mass in a quick and inexpensive shock procedure whose beneficial results are not comprised by subsequent processing steps, such as the very common heat annealing processing or drawing-pressing type processing.

Magnetic flux-relaxation experiments accomplished by the subject inventors on a composite specimen of $YBa_2Cu_3O_{7-e}$+Ag shock-compacted at 167 kbar showed that the flux-pinning energy at 70° K. is enhanced a factor of 2. This enhancement persisted after annealing at 890° C. for 53 hours, although the majority defect before and after post-shock anneal changed. The increased pinning energy is believed to be caused by up to $10^{12}$ cm$^{-2}$ shock-induced dislocations lying in the <100> and <110> directions. Annealing removed these dislocations but formed a high density of residual stacking faults in the (001) planes with an average separation in the [001] direction of 0.04 μm. These results indicate that intragranular critical current densities can be increased significantly in bulk materials by shock processing. Substantial quantities of high-$T_c$ oxides could be processed efficiently by large explosive systems.

The following experiments provide evidence that shock-induced defects, as well as residual defects remaining after shocking and re-annealing, substantially enhance the intragranular $J_c$ near liquid-$N_2$ temperatures.

The present method can be usefully employed to improve the superconducting qualities and robustness of a wide range of conventional superconducting materials and high-$T_c$ materials, either singly or in mixtures. Examples of such appropriate materials are the ceramic oxides of the group $XBa_2Cu_3O_{7-e}$ where X may be Y, Nd, Sm, Eu, Gd, Dy, Ho, Er, Tm, Rb, and Lu or other rare earth elements and O may be partially replaced by F, Cl, or other halogens and where e is small number less than 1.

Examples of some of the newer materials are $Bi_2Sr_2Ca_1Cu_2O_x$, $Tl_2Ca_2Ba_2Cu_3O_y$, and other related compounds. Additionally, newly discovered compounds which have a different electronic structure from the high-$T_c$ compounds are being developed and will also benefit from the processing techniques of the present invention. These materials have electron charge carriers, rather than hole charge carriers in the high-$T_c$ materials. These include $Nd_{2-x}Ce_xCuO_4$.

Appropriate combinations of other materials which can he improved by the methods the present invention would include, but not be limited to Pb/Mo/S, Eu/Mo/S, Sn/Eu/Mo/S, Pb/Eu/Mo/S, La/Eu/Mo/S, Sn/Al/Mo/S, Nb/N, Mo/N, V/Si, Nb/Si, Nb/Al/Ge, Nb/Al, Nb/Ga Nb/Ti and Nb/Zr.

The shock preprocessing method of the present invention is well adapted to mass production processing and continuous processing techniques. The shock step can be accomplished through any number of different means, including two-stage light-gas guns, rail guns, air guns, explosives, magnetic-driven shocking, etc. Another method of producing the inventive defects is to mechanically deform the superconducting material at high strain rates. This can be accomplished by use of a Hopkinson-Barr dynamic strain apparatus, rapidly applied gas pressure in a conventional opposed anvil press, or any other of numerous mechanical means well known to practitioner of the art.

Using the various techniques a number of samples can be shocked simultaneously in a club-sandwich style approach. In this aspect of the present invention, metal or other material and superconducting materials are layered sequentially, or spaced with non-adhering material, and then shocked simultaneously.

The robust superconducting materials produced by the present inventive preprocessing method would be highly desirable in a number of usages. Potential applications for the present invention are long power transmission cables, high field magnetic uses such as inductive energy stores, motors and generators, and magnetic fusion, among others. Computer technology could employ the present invention in such areas as Josephson Junction devices and superconducting transmission lines. Accelerators and free electron laser work would benefit from the present invention. In these areas, the inventive materials can be used to produce constructs for high Q, high power RF structures, beam transport magnets, high emittance accelerator cathode structures, and wriggler magnets, among other applications. Additionally, there are new and unforeseeable applications for the inventive material which will be developed in the future.

EXAMPLE 1

$YBa_2Cu_3O_{7-s}$ powder (provided by D. G. Hinks of Argonne National laboratory) was sieved to provide a batch of powder having a characteristic particle size of 28–45 $\mu$. This powder was then mixed with silver powder (size=20–30 $\mu$m) in the proportion of 70% $YBa_2Cu_3O_{7-8}$ powder and 30% silver powder by volume. The initial composite sample was disk-shaped with a mass of 0.19 g, diameter of 10 mm, and a thickness of 0.5 mm. Shock-compaction was performed with a two-stage light-gas gun by impacting a 5 g plastic projectile at a velocity of 2.74 km/s onto a Cu capsule containing the powder specimen.

Results Optical microscopy showed that substantial shock-induced fracture occurred in the specimen shocked at 167 kbar, the average grain size being reduced from about 10 $\mu$m to less than 1 $\mu$m. X-ray diffraction showed that a portion of this specimen was transformed to the non-superconducting tetragonal phase. These tetragonal phase regions appear to be limited to the surfaces of the powder particles, and are apparently the result of the high temperatures generated at particle surfaces during the shock event.

After re-annealing the shocked sample at 890° C. for 53 hours, however, the specimen was found to have a transport $J_c$ of 320 A/cm$^2$ at 77° K. The results of diamagnetic screening measurements on the starting powder, the as-shocked specimen, and the shocked+re-annealed specimen are given in FIG. 1. As shown previously shock-compaction does not reduce $T_c$ (Nellis et al, *High Temperature Superconducting Compounds*, Whang et al, Ed. TMS Pub Warrendale Pa., p. 249, 1989). Although there was a decrease in the magnitude of the diamagnetic signal with shocking, this decrease could be essentially accounted for by the decrease in the characteristic grain size (Clem et al., *Japan. J. Applied Phys.*, Vol. 26, Sup. 26-3, p. 116, 1987). Because this 167 kbar re-annealed sample exhibited the highest transport $J_c$ observed thus far in a shocked material, the 167 kbar specimens were chosen for an extensive investigation of magnetic properties, including flux-creep measurements.

EXAMPLE 2

To determine the pinning energies for magnetic flux bundles in the three samples produced in Example 1, magnetic relaxation experiments were performed. The data was interpreted in terms of the flux-creep model. (Kim et al., *Phys. Rev. Lett.*, Vol. 9, p. 306, 1962; Beasley et al., *Phys. Rev.*, Vol. 181, p. 682, 1969; Yeshurum et al, *Phys. Rev. Lett.*, Vol. 60, p. 2202, 1988). An MPMS Quantum Design SQUID Magnetometer was used. The samples were zero-field-cooled to a desired temperature below $T_c$, and were then subjected to a 10 kOe field while the magnetic moment was repeatedly measured. Due to the fact that the pinning forces on the magnetic flux bundles are finite, the diamagnetic moment was not constant over time but, rather, decayed at a logarithmic rate, in agreement with the flux-creep model Beasley et al., (*Phys. Rev.*, Vol. 181, p. 682, 1969) calculated the decay rate for a cylindrical sample and found that the rate of magnetization decay was related to the flux-bundle pinning energy $U_o$ by the equation:

$$\frac{dM(H)}{d\ln(t)} = \frac{rJ_c}{3c}\frac{kT}{U_o}. \quad \text{(Eqn. 1)}$$

where r is the radius of the cylinder and $J_c$ is the critical current of the sample. Within the approximation that the grains of the inventive weakly-linked granular samples were cylindrical, the above equation was applied with r now being the characteristic grain size and $J_c$ being the intrinsic, or intragranular, critical current density.

To determine $rJ_c$ and thereby obtain $U_o$, magnetic hysteresis experiments were performed on three samples. Again, for a cylindrical geometry, M(H), the width of the magnetization loop at field H, was related to $rJ_c$ by the equation $$\Delta M(H) = \frac{2}{3}\frac{rJ_c}{c} \quad \text{(Eqn. 2)}$$

(C. P. Beam, *Rev. Mod. Phys.*, Vol. 36, p. 31, 1964). By combining Eqns. 2 and 3 the following grain-size-independent expression was obtained for the $U_o$, the flux pinning energy:

$$U_o(H) = \left[\frac{\Delta M(H)}{\frac{dM(H)}{d\ln(t)}}\right]\frac{kT}{2}. \quad \text{(Eqn. 3)}$$

Flux relaxation and magnetic hysteresis experiments, then, were performed on the three specimens having different grain sizes at several temperatures. From this data and Eqn. 3, effective flux bundle pinning energy, $U_o$, at H=10 kOe as a function of temperature for the starting powder, the as-shocked composite, and the shocked composite after it had been annealed at 890° C. for 53 hours was determined.

Figure 2:
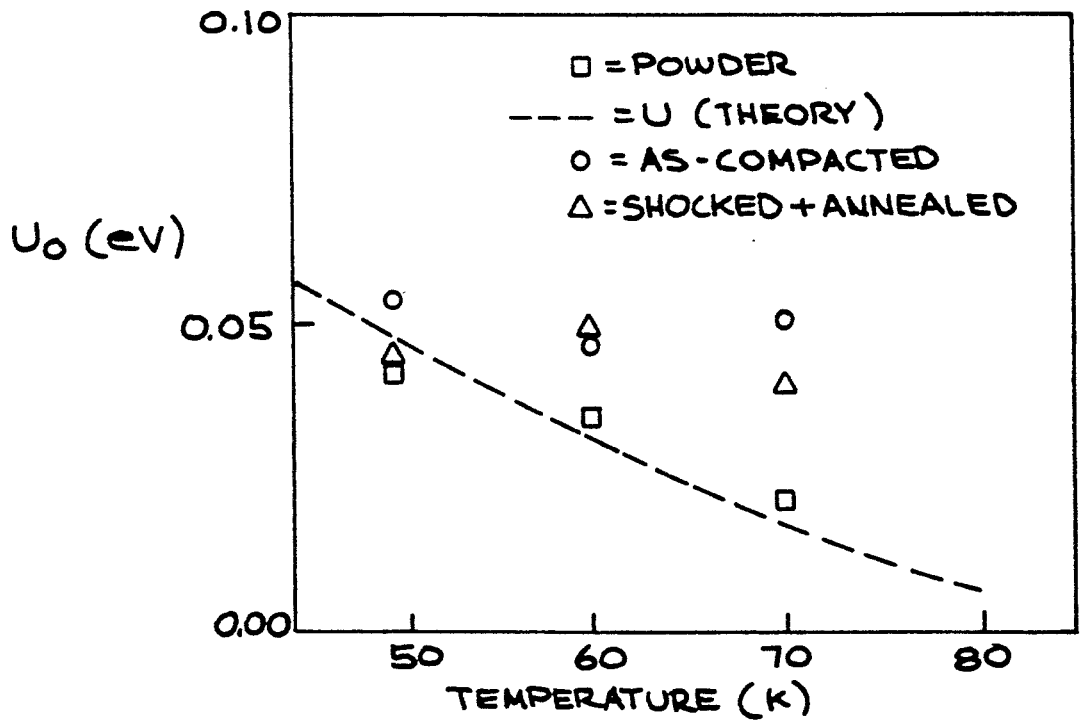
FIG. 2 is a graph which shows the flux-pinning energy as a function of temperature for the three samples of examples. The basis of this test is described in Yeshurum and Malozemoff, *Phys. Rev. Lett.*, Vol. 60 p. 2202, 1988.

Results As seen in FIG. 2, the shock-compaction process resulted in a dramatic increase in the effective pinning energy $U_o$, the flux pinning energy approximately doubling at 70° K. as a result of shocking. FIG. 2 also shows that the shocked specimen largely retained its increased pinning energy even after being annealed in oxygen at 890° C. for 53 hours, indicating that a high density of flux-pinning defects remained in the material even after high-temperature processing for a long period of time. Finally, whereas the starting $YBa_2Cu_3O_{7-e}$ powder obeys the $U_o \sim (1-T/T_c)^{3/2}$ scaling formulas of Yeshurun and Malozenmoff (*Phys. Rev. Lett.*, Vol. 60, p. 2202, 1988) (dashed line of FIG. 2), the as-shocked and shocked+re-annealed samples clearly do not, suggesting a complicated interaction between the magnetic flux bundles and the pinning site, presumably because of the extraordinarily high density of flux pinning sites in these shocked samples.

EXAMPLE 3

To determine the defect structure of the as-shocked and shocked+re-annealed samples, TEM analysis was performed on the shocked specimens. The TEM foils were obtained by mechanically polishing and then ion milling the shocked specimens.

Figure 3:
FIG. 3 is a TEM showing <100> and <110> dislocations in as-shocked specimen (167 kbar) of $YBa_2Cu_3O_{7-8}$+Ag. These dislocations lie on the (001) planes.

The interiors of the grains had been heavily deformed by the shock process. The dislocation density, for instance, was estimated to be as large as $10^{12}$ cm$^{-2}$, which was about two orders of magnitude higher than that seen in specimens which had been slowly deformed in a press (Kramer et al, id). These dislocations form arrays with line vectors of $<100>$ and $<110>$, and dislocation loops all lying in the (001) planes (FIG. 3).

The twin spacing in the as-shocked specimen was much narrower than in typical as-sintered samples, indicating that some of the generated strain was accommodated by deformation twinning. Moreover, the observed twin lamellae showed some distortion due to substantial lattice strain; this distortion apparently resulted form the numerous $<100>$ and $<110>$ dislocations crossing these twin lamellae. The average twin spacing is approximately 0.02 $\mu$m; however, it was not possible to be precise about this value because the twin lamellae are so heavily deformed due to the large number of dislocations.

Figure 4:
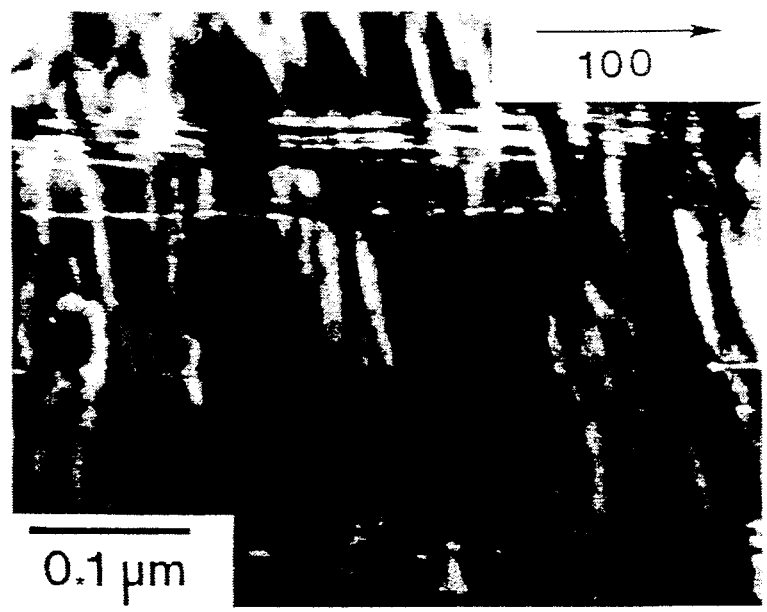
FIG. 4 is a TEM showing many extrinsic stacking faults observed in a shocked and re-annealed specimen of $YBa_2Cu_3O_{7-8}$+Ag.

In order to pass a superconducting current through a bulk shock-compacted specimen, the sample was re-annealed at 890° C. for 53 hours. FIG. 1 showed that the screening signal of the re-annealed specimen had not reverted to that of the un-shocked powder, suggesting that a high density of defects was still present in the material. This was confirmed by the TEM analysis of the shock-compacted, re-annealed specimen. Although few dislocations remained in the sample after re-annealing, an extremely high density of extrinsic stacking faults lying in the (001) planes were present (FIG. 4). These stacking faults took the form of an intercalation of an extra Cu-O plane offset by b/2 (Ourmazd et al, *J. Elec. Micro. Tech.*, Vol. 8, p. 251, 1988), and had an average separation in the [001] direction of 0.04+0.02 $\mu$m. The separation between fluxoids in a triangular lattice at 10 kOe is 0.05 $\mu$m, which is comparable to the separation between stacking faults, as expected for effective pinning.

The replacement of dislocation with extrinsic stacking fault after annealing was also found in bulk samples of $YBa_2Cu_3O_{7-e}$ which had been deformed and then re-annealed (Kramer, id). Since the separation between partial dislocations associated with these stacking faults was fairly large ($=0.5$ $\mu$m), the extrinsic stacking fault energy was not very high ($=10$ ergs/cm$^2$), and this fact may partially account for the stability of the stacking faults even with high-temperature annealing.

Finally, in contrast to the as-shocked material, the twin lamellae in the re-annealed material (spacing=0.06+0.02 $\mu$m) showed little distortion, which implied that there was little residual stress and a relatively low dislocation density present in the annealed material.

It was found that subjecting a $YBa_2Cu_3O_{7-e}$ sample to a 167 kbar shock wave resulted in a large increase in magnetic flux pinning due to the introduction of a high density of shock-induced defects. In the as shocked material the increased pinning energy appeared to be due to dislocations with line vectors of $<100>$ and $<110>$ these dislocations having loops lying in the (001) planes. In the shocked+re-annealed material, the increased pinning is presumably due to the partial dislocation associated with the extrinsic stacking faults.

Although high densities of twin boundaries were present in the as-shocked and shocked+re-annealed samples, these twin boundaries are believed to play a relatively minor role in flux pinning. It should be noted that the stress-induced dislocations and stacking faults did not significantly disrupt the Cu-O conducting planes. Although the Cu-O planes were slightly distorted at places in order to accommodate the dislocations and stacking fault present in the shocked samples, the Cu-O planes were not disordered as a result of shocking. Some evidence of the fact that these defects do not degrade the superconducting properties of the samples was provided by SQUID magnetic screening measurements which showed no change in $T_c$ between shocked and un-shocked samples.

EXAMPLE 4

To investigate the effects of shock-induced defects on critical current density $J_c$, single crystals of $Bi_2Sr_2CaCu_2O_8$ and $YBa_2Cu_3O_{7-e}$ were shocked to 50 kbar. The crystals were about 30 μm thick and about 1 mm × 1 mm in area. They were shocked in the same Cu specimen holder design as used to compact the $YBa_2Cu_3O_{7-x}$+Ag compact in Examples 1-3. Into the 10 mm diameter specimen cavity was first placed layers of Ag powder, then a 75 μm thick Ag foil which covered the powder, then the crystals—4 mm apart and each 1 about 2 mm from the center, then another Ag foil, and then Ag powder. The Ag powder acted as a soft pressure medium of about the same density as the crystals. The Cu cap was place on the capsule, which was then placed in a steel shock recovery fixture. A plastic projectile was accelerated by a two-stage light-gas gun to generate a 50 kbar shockwave in the Cu capsule.

Figure 5:
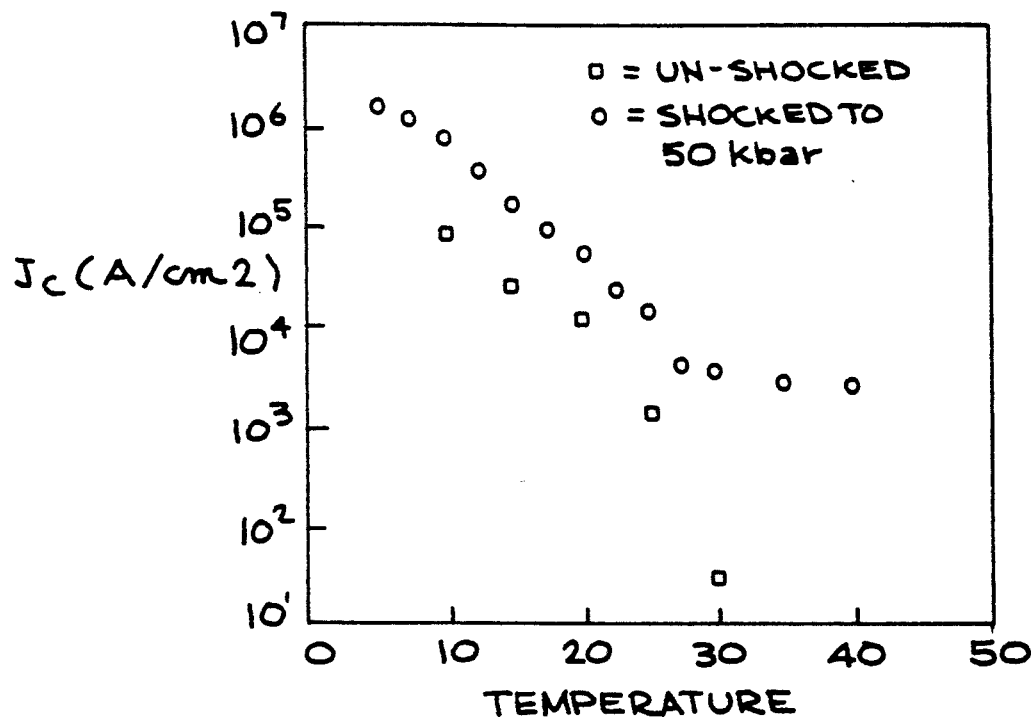
FIG. 5 is a graph showing the critical current density at a magnetic field of 0.1 T as a function of temperature for a $Bi_2Sr_2CaCu_2O_x$ single crystal shocked to 50 kbar and an unshocked crystal, as shown in Example 4.

On recovery it was discovered that the $Bi_2Sr_2CaCu_2O_8$ crystal was broken into a few pieces large enough (about 0.5 mm on edge) to make magnetic measurements using a SQUID magnetometer. The $YBa_2Cu_3O_{7-e}$ crystal was broken into tiny fragments too small to study individually. The critical current densities in the $Bi_2Sr_2CaCu_2O_8$ shocked and unshocked crystals are shown in a magnetic field of 0.1 T in FIG. 5 as a function of temperature. The current densities were derived from the magnetic data by the standard Bean model. The $J_c$ of the shocked crystal was about an order of magnetic larger than for the unshocked crystal for temperature below about 27 K. At higher temperature $J_c$ of the shocked specimen persists at about $10^3$ A/cm$^2$ while the $J_c$ of the unshocked crystal falls below 10 A/cm$^2$ above 30 K.

Figure 6:
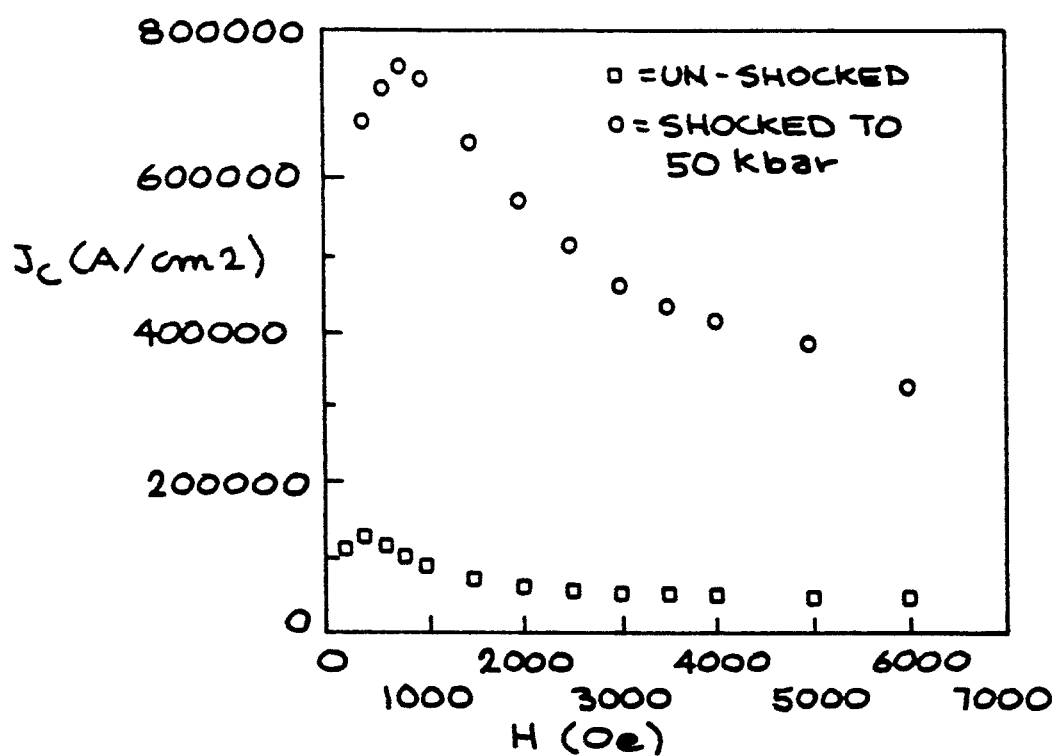
FIG. 6 is a graph showing the critical current density at 10 K as a function of magnetic field for a $Bi_2Sr_2CaCu_2O_x$ single crystal shocked to 50 kbar and an unshocked crystal.

The $J_c$'s at a temperature of 10 K were plotted versus magnetic fieled for shocked and unshocked crystals in FIG. 6. The $J_c$ for this shocked specimen is 5-10 times larger over the range of magnetic field up to 0.6 T.

Since the increased shock-induced pinning of the subject invention is largely retained even after a long, high-temperature anneal, considerable freedom is available in choosing post-shock treatment without losing the beneficial effects of shock processing. Critical current densities could be increased with other fabrication methods if a shock processing step were included in material preparation. Large quantities of high-$T_c$ oxides can be shocked efficiently using explosive systems ("Shock Waves for Industrial Applications," edited by L. E. Murr, Noyes Publications, Park Ridge, N.J., 1988)

Various treatment parameters can be selected so that the separation between the stacking faults, for example, is comparable to or less than the expected separation between superconducting fluxoids. For a triangular lattice of fluxoids the separation is $L=0.155$ μm[B(kOe)]$^{-\frac{1}{2}}$, where B is the magnetic field in kOe. Thus, for strong flux pinning at 10 kOe, for example, stacking faults should be separated by about 0.05 μm or less. The stacking faults will generally have an average separation of 0.5 μm or less, a more preferred range of separation being 0.1 μor less. The most preferred range for a number of uses is 0.01-0.06 μm.

We claim:

1. A method of making a superconducting construct with increased flux pinning energy which comprises:
    a. applying a high strain rate deformation to a superconducting precursor material in an amount sufficient to produce defects serving as flux pinning sites therein;
    b. grinding said material; and
    c. fabricating a superconducting construct incorporating the ground material.

2. The method as in claim 1 wherein the fabrication step includes processes selected from the group consisting of drawing or extrusion followed by sintering and hot pressing.

* * * * *